United States Patent
Shao et al.

(10) Patent No.: US 11,504,863 B2
(45) Date of Patent: Nov. 22, 2022

(54) HEAT DISSIPATION DEVICE AND ROBOT USING SAME

(71) Applicant: Delta Electronics, Inc., Taoyuan (TW)

(72) Inventors: Chi-Huan Shao, Taoyuan (TW); Hung-Sheng Chang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 195 days.

(21) Appl. No.: 16/906,498

(22) Filed: Jun. 19, 2020

(65) Prior Publication Data

US 2021/0138669 A1    May 13, 2021

(30) Foreign Application Priority Data

Nov. 7, 2019 (CN) .......................... 201911080344.7

(51) Int. Cl.
*B25J 19/00* (2006.01)
*H05K 7/20* (2006.01)

(52) U.S. Cl.
CPC ...... *B25J 19/0054* (2013.01); *H05K 7/20309* (2013.01); *H05K 7/20327* (2013.01)

(58) Field of Classification Search
CPC ......... F28D 15/04; H01L 23/427; H05K 7/20; H05K 7/20309; H05K 7/20327; B25J 19/0054
See application file for complete search history.

(56) References Cited

U.S. PATENT DOCUMENTS

| 10,285,766 | B2 | 5/2019 | Soundararajan |
| 2002/0014874 | A1 | 2/2002 | Hietmann et al. |
| 2007/0096673 | A1* | 5/2007 | Hagn ............... B25J 9/0009 318/568.12 |
| 2016/0120058 | A1 | 4/2016 | Shedd et al. |
| 2017/0234624 | A1* | 8/2017 | Cai ................. F28D 15/046 165/104.26 |
| 2019/0061178 | A1 | 2/2019 | Chikara et al. |

(Continued)

FOREIGN PATENT DOCUMENTS

| CN | 1763936 A | 4/2006 |
| CN | 102714171 A | 10/2012 |

(Continued)

*Primary Examiner* — Gordon A Jones
(74) *Attorney, Agent, or Firm* — Kirton McConkie; Evan R. Witt

(57) ABSTRACT

A heat dissipation device and a robot using the same are provided. The heat dissipation device comprises a porous material layer, a transporting tube and a liquid. The at least one porous material layer is disposed on a housing surface of a robot. The porous material layer has an evaporation surface and an accommodation space. The evaporation surface is disposed through and exposed from the housing surface. The evaporation surface and the accommodation space are in fluid communication with each other. The transporting tube is connected to the at least one porous material layer and in fluid communication with the accommodation space. The liquid is transported into the at least one accommodation space through the transporting tube and exposed from the evaporation surface. Thus, the liquid evaporates at the evaporation surface to reduce a temperature of the housing surface of the robot via convection and evaporation.

20 Claims, 6 Drawing Sheets

(56) References Cited

U.S. PATENT DOCUMENTS

| | | | | |
|---|---|---|---|---|
| 2019/0163214 A1* | 5/2019 | Haven | ................... | G01B 11/25 |
| 2020/0221605 A1* | 7/2020 | Vanderwees | .............. | B22F 3/11 |
| 2021/0180874 A1* | 6/2021 | Eadelson | ........... | H05K 7/20809 |
| 2021/0370528 A1* | 12/2021 | Hosek | ................. | B25J 19/0054 |

FOREIGN PATENT DOCUMENTS

| | | | |
|---|---|---|---|
| CN | 103019346 | A | 4/2013 |
| CN | 103629963 | A | 3/2014 |
| CN | 104019685 | A | 9/2014 |
| CN | 105716461 | A | 6/2016 |
| CN | 106363665 | A | 2/2017 |
| CN | 108184324 | A | 6/2018 |
| CN | 108374883 | A | 8/2018 |
| CN | 208179587 | U | 12/2018 |
| CN | 109773753 | A | 5/2019 |
| EP | 1920893 | A1 | 5/2008 |
| EP | 3517874 | A1 | 7/2019 |
| TW | 200731043 | A | 8/2007 |
| TW | 200732167 | A | 9/2007 |
| TW | 200834293 | A | 8/2008 |
| TW | I382811 | B | 1/2013 |

* cited by examiner

HEAT DISSIPATION DEVICE AND ROBOT USING SAME

CROSS-REFERENCE TO RELATED APPLICATION

This application claims priority to China Patent Application No. 201911080344.7, filed on Nov. 7, 2019. The entire contents of the above-mentioned patent application are incorporated herein by reference for all purposes.

FIELD OF THE INVENTION

The present disclosure relates to a heat dissipation device, and more particularly to a heat dissipation device capable of taking away a large amount of heat from a main body of a robot to dissipate heat via convection and evaporation, and the robot using the same.

BACKGROUND OF THE DISCLOSURE

With the development of robotics technology, the application of automated mechanical devices has been realized in the industrial manufacturing, the medical treatments, the entertainment services, the military technology, the semiconductor manufacturing and the space exploration. Taking a conventional robotic arm as an example, it is possible to accurately position the robotic arm to a specific position in the three-dimensional space for performing tasks by programming the instructions. However, as the complexity of the tasks performed by the robotic arm work is increased, the motion pattern of the overall structure is more variable, and the rotation numbers of joints of the robot arm are also increased frequently. In a long period of use, a large amount of heat is generated. If the heat is not dissipated in time, the heat is accumulated continuously and the temperature is raised. Consequently, the malfunction of the robot or the robotic arm is caused.

Most of conventional heat dissipation devices for the robot are focused on transferring the internal heat to the housing. The common way is to increase the surface area through the structural design of the housing. However, when the air is utilized to flow through the surface area increased by the production technology, the heat taken away through the surface area is still limited, and the heat dissipation capability of the housing cannot be effectively improved. In addition, there are also some designs of adding a heat sink on the robot housing to increase the heat dissipated by the air flow. However, the heat dissipation effect of the heat sink is still limited by the surface area, and the arrangement of the heat sink greatly increases the interference space, thereby reducing the workable area of the robot arm and affecting the performance of the robot.

Therefore, there is a need of providing a heat dissipation device capable of taking away a large amount of heat from a main body of a robot to dissipate heat via convection and evaporation, and the robot using the same, to enhance the heat dissipation efficiency of the housing of the robot and address the above issues encountered by the prior arts.

SUMMARY OF THE INVENTION

An object of the present disclosure is to provide a heat dissipation device and a robot using the same. A porous material layer is added to a designed area of a housing of the robot by, for example directly machining or additional mounting. The porous material layer is coupled to an internal transporting tube to transport a liquid to the housing surface for heat dissipation. Since an evaporation surface of the porous material layer keeps the liquid exposed from the housing surface, the liquid supplied to the evaporation surface undergoes the convection and evaporation in specific conditions of temperature, airflow or natural evaporation, so as to dissipate the heat. Consequently, the liquid becomes a gas due to phase change, and a lot of heat generated by the body of the robot is dissipated therefrom.

Another object of the present disclosure is to provide a heat dissipation device and a robot using the same. By changing the porosity or porous density of the porous material layer in a single layer or multiple layers, the retention and the replenishment speed of the liquid in the porous material layer is increased, and it is advantageous for enhancing the heat dissipation efficiency of the housing of the robot.

A further object of the present disclosure is to provide a heat dissipation device and a robot using the same. The transporting tube in connection with the porous material layer is further implemented through a capillary action or an additional pressurized module, and the liquid is continuously transported to the evaporation surface of the porous material layer, so that the heat is dissipated via convection and evaporation. Thus, the temperature of the housing surface of the robot is reduced. It prevents from accumulating the heat generated by the robot during operation, and the abnormal operation or malfunction of the robot is avoided.

In accordance with an aspect of the present disclosure, a heat dissipation device is provided and includes at least one porous material layer, a transporting tube and a liquid. The at least one porous material layer is disposed on a housing surface of a robot. The at least one porous material layer has at least one evaporation surface and at least one accommodation space, the at least one evaporation surface is disposed through and exposed from the housing surface, and the at least one evaporation surface and the at least one accommodation space are in fluid communication with each other. The transporting tube is connected to the at least one porous material layer and in fluid communication with the at least one accommodation space. The liquid is transported into the at least one accommodation space through the transporting tube and exposed through the evaporation surface, wherein the liquid evaporates at the at least one evaporation surface to reduce a temperature of the housing surface of the robot.

In an embodiment, the at least one porous material layer has an average pore diameter and a porosity, the average pore diameter is less than 0.1 mm, and the porosity is ranged from 15% to 90%.

In an embodiment, the at least one porous material layer further has at least one first porous material layer and at least one second porous material layer, the at least first porous material layer has at least one first accommodation space, and the at least one second porous material layer has at least one second accommodation space. The at least one first accommodation space is connected to the at least one evaporation surface, the at least one second accommodation space is connected to the transporting tube, and the liquid is transported from the transporting tube, flows through the at least one second accommodation space and the at least one first accommodation space, and is transported to the at least one evaporation surface.

In an embodiment, the at least one first porous material layer has a first average pore diameter, the at least one second porous material layer has a second average pore diameter, and the first average pore diameter is equal to or less than the second average pore diameter, wherein the first average pore diameter is less than 0.1 mm, and the second average pore diameter is ranged from 0.1 mm to 1 mm.

In an embodiment, the at least one first porous material layer has a first porosity, the at least one second porous material layer has a second porosity, and the first porosity is equal to or less than the second porosity, wherein the first porosity is ranged from 15% to 50%, and the second porosity is ranged from 50% to 90%.

In an embodiment, the heat dissipation device further has a liquid storage tank having a liquid storage space and connected to the transporting tube. The liquid storage space is in fluid communication with the at least one accommodation space through the transporting tube.

In an embodiment, the at least one porous material layer has an altitude level higher than that of the liquid storage tank.

In an embodiment, the transporting tube has an inner diameter ranged from 0.5 mm to 2 mm.

In an embodiment, the heat dissipation device further has a pressurizing module connected to the transporting tube and driving the liquid to flow into the at least one accommodation space through the transporting tube, wherein the transporting tube has an inner diameter ranged from 2 mm to 30 mm.

In an embodiment, the transporting tube has a plurality of microtubules, and each of the microtubules is in fluid communication with the at least one accommodation space, wherein each of the microtubules has an inner diameter ranged from 0.5 mm to 2 mm.

In accordance with another aspect of the present disclosure, a robot is provided and includes a housing and a heat dissipation device. The housing has a housing surface. The heat dissipation device is embedded within the housing and partially exposed from the housing surface. The heat dissipation device includes at least one porous material layer, a transporting tube and a liquid. The at least one porous material layer is disposed on the housing surface of the robot. The at least one porous material layer has at least one evaporation surface and at least one accommodation space, the at least one evaporation surface is disposed through and exposed from the housing surface, and the at least one evaporation surface and the at least one accommodation space are in fluid communication with each other. The transporting tube is connected to the at least one porous material layer and in fluid communication with the at least one accommodation space. The liquid is transported into the at least one accommodation space through the transporting tube and exposed through the evaporation surface, wherein the liquid evaporates at the at least one evaporation surface to reduce a temperature of the housing surface of the robot.

In an embodiment, the at least one porous material layer has an average pore diameter and a porosity, the average pore diameter is less than 0.1 mm, and the porosity is ranged from 15% to 90%.

In an embodiment, the at least one porous material layer further has at least one first porous material layer and at least one second porous material layer, the at least first porous material layer has at least one first accommodation space, and the at least one second porous material layer has at least one second accommodation space, wherein the at least one first accommodation space is connected to the at least one evaporation surface, the at least one second accommodation space is connected to the transporting tube, and the liquid is transported from the transporting tube, flows through the at least one second accommodation space and the at least one first accommodation space, and is transported to the at least one evaporation surface.

In an embodiment, the at least one first porous material layer has a first average pore diameter, the at least one second porous material layer has a second average pore diameter, and the first average pore diameter is equal to or less than the second average pore diameter, wherein the first average pore diameter is less than 0.1 mm, and the second average pore diameter is ranged from 0.1 mm to 1 mm.

In an embodiment, the at least one first porous material layer has a first porosity, the at least one second porous material layer has a second porosity, and the first porosity is equal to or less than the second porosity, wherein the first porosity is ranged from 15% to 50%, and the second porosity is ranged from 50% to 90%.

In an embodiment, the heat dissipation device further has a liquid storage tank having a liquid storage space and connected to the transporting tube, wherein the liquid storage space is in fluid communication with the at least one accommodation space through the transporting tube.

In an embodiment, the at least one porous material layer has an altitude level higher than that of the liquid storage tank.

In an embodiment, the transporting tube has an inner diameter ranged from 0.5 mm to 2 mm.

In an embodiment, the heat dissipation device further has a pressurizing module connected to the transporting tube and configured to drive the liquid to flow into the at least one accommodation space through the transporting tube, wherein the transporting tube has an inner diameter ranged from 2 mm to 30 mm.

In an embodiment, the transporting tube has a plurality of microtubules, and each of the microtubules is in fluid communication with the at least one accommodation space, wherein each of the microtubules has an inner diameter ranged from 0.5 mm to 2 mm.

The above contents of the present disclosure will become more readily apparent to those ordinarily skilled in the art after reviewing the following detailed description and accompanying drawings, in which:

DETAILED DESCRIPTION OF THE
PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
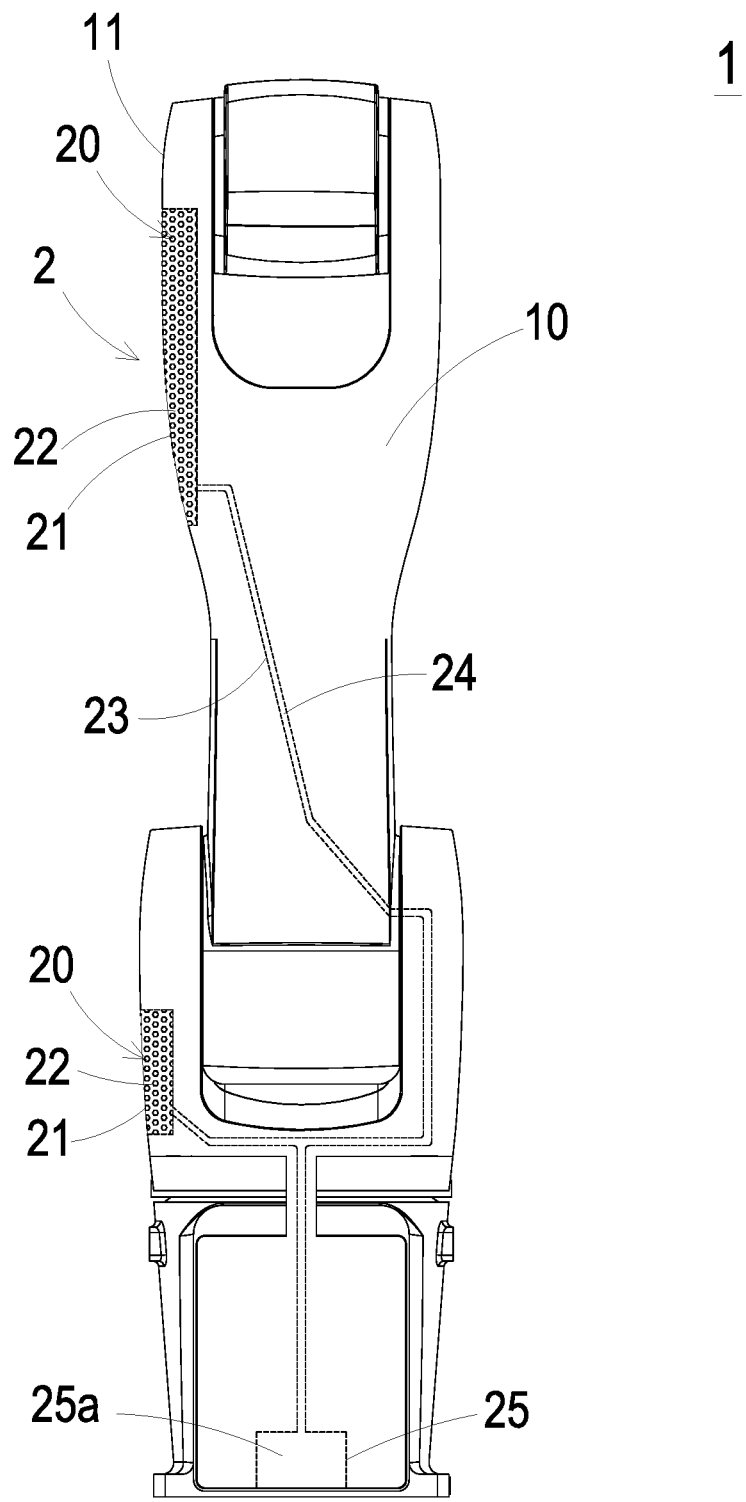
FIG. 1 shows a heat dissipation device and a robot using the same according to a first embodiment of the present disclosure.

FIG. 1 shows a heat dissipation device and a robot using the same according to a first embodiment of the present disclosure. In the embodiment, the robot 1 is for example but not limited to an active part of the robotic arm, which is accompanied by a large amount of heat generation during operation. Certainly, the present disclosure is not limited to the type of the robot 1. In the embodiment, the robot 1 includes at least one housing 10, and the housing 10 has a housing surface 11. The heat generated by the robot 1 causes the temperature of the housing surface 11 to increase. In order to dissipate the heat generated by the robot 1 during operation, the robot 1 further includes a heat dissipation device 2. In the embodiment, the heat dissipation device 2 includes at least one porous material layer 20, a transporting tube 23 and a liquid 24. Preferably but not exclusively, the at least one porous material layer 20 is a foamed metal disposed on the housing surface 11 of the robot 1 in a direct processing or an additional mounting manner. Certainly, the type and the arrangement of the porous material layer 20 are adjustable according to the practical requirement. The present disclosure is not limited thereto. In the embodiment, the at least one porous material layer 20 has at least one evaporation surface 21 and at least one accommodation space 22. The at least one evaporation surface 21 is disposed through and exposed from the housing surface 11, and the at least one evaporation surface 21 and the at least one accommodation space 22 are in fluid communication with each other. Preferably but not exclusively, the housing surface 11 and the at least one evaporation surface 21 disposed therethrough and exposed therefrom are coplanar. In the embodiment, the at least one porous material layer 20 has an average pore diameter and a porosity. Preferably but not exclusively, the average pore diameter is less than 0.1 mm, and the porosity is ranged from 15% to 90%. On the other hand, in the embodiment, the transporting tube 23 is connected to the at least one porous material layer 20 and in fluid communication with the at least one accommodation space 22. Preferably but not exclusively, the liquid 24 is the water, which is transported into the at least one accommodation space 22 through the transporting tube 23 and exposed through the at evaporation surface 21, wherein the liquid 24 on the at least one evaporation surface 21 undergoes convection and evaporation in specific conditions of temperature, airflow or natural evaporation, so that the liquid becomes a gas due to phase change and a lot of heat generated by the body of the robot 1 is dissipated. Thus, the liquid 24 evaporates at the at least one evaporation surface 21 to reduce the temperature of the housing surface 11 of the robot 1.

For example, in case that the robot 1 is operated under a condition of a room temperature of 25° C., the water is utilized as the liquid 24 for heat dissipation and is transported to the evaporation surface 21 of the porous material layer 20. The evaporation rate of the liquid 24 is affected by temperature, pressure, humidity, surface area or airflow rate. Preferably but not exclusively, the evaporation rate is about 50 mg/min·m². The liquid 24 becomes a gas due to the phase change, so as to dissipate the heat. Preferably but not exclusively, the liquid 24 takes away the heat of 26.95 kcal/min·m². Since the latent heat of the water is 539 kcal/kg, when the phase change is generated, a large amount of heat can be taken away from the housing surface 11 of the robot 1. Consequently, the temperature of the housing surface 11 of the robot 1 is reduced effectively. In other embodiments, other coolant is utilized as the liquid 24 for heat dissipation, so as to meet the cooling requirements in different cases. Notably, the evaporation surface 21 of the porous material layer 20 is disposed to expose the liquid 24 from the housing surface 11. In addition to the convection due to temperature and airflow for heat dissipation, the liquid 24 is utilized to dissipate a large amount of heat in a phase change manner. Thus, the temperature of the housing surface 11 of the robot 1 is decreased. It prevents from accumulating the heat generated by the robot 1 during operation, and the abnormal operation and the malfunction of the robot 1 are avoided.

In the embodiment, the transporting tube 23 is for example but not limited to a capillary microtubule. Preferably but not exclusively, the transporting tube 23 has an inner diameter ranged from 0.5 mm to 2 mm. The liquid 24 is spontaneously transported into the accommodation space 22 of the porous material layer 20 via the action of the capillary phenomenon and exposed to the evaporation surface 21. Since the average pore diameter is less than 0.1 mm, and the porosity is ranged from 15% to 90%, the liquid 24 is continuously transported to the evaporation surface 21 for heat dissipation via evaporation without overflowing from the evaporation surface 21. In the embodiment, the retention and the replenishment speed of the liquid 24 in the porous material layer 20 is increased by changing the porosity or porous density of the porous material layer 20. It is advantageous to enhance the heat dissipation efficiency of the housing 10 of the robot 1.

In the embodiment, the heat dissipation device 2 further has a liquid storage tank 25 having a liquid storage space 25a for storing the liquid 24. The liquid storage tank 25 is connected to the transporting tube 23. The liquid storage space 25a is in fluid communication with the at least one accommodation space 22 through the transporting tube 23. As described above, due to a capillary phenomenon, the liquid 24 is continuously transported from the liquid storage tank 25 into the accommodation space 22 of the porous material layer 20 through the transporting tube 23, such as a capillary microtubule. The liquid is further supplied to the evaporation surface 21 of the porous material layer 20 for heat dissipation via convection and evaporation. Thus, the temperature of the housing surface 11 of the robot 1 is decreased. It prevents the heat generated by the robot 1 during operation from being accumulated, and the abnormal operation and the malfunction of the robot 1 are avoided. Preferably but not exclusively, the heat dissipation device 2 has two porous material layers 20 disposed at two places. The size, the thickness and the number of the porous material layers 20 are adjustable according to the practical requirements, and the present disclosure is not limited thereto. With the connection of the transporting tube 23, such as a capillary microtubule, the liquid is continuously transported from the liquid storage tank 25 to the accommodation spaces 20 of the two porous material layers 20 through the transporting tube 23. In the embodiment, each of the two porous material layers 20 has an altitude level higher than that of the liquid storage tank 25, so that the liquid 24 is continuously supplied to the evaporation surfaces 21 of the two porous material layers 20 for heat dissipation via convection and evaporation. In other embodiments, the relative arrangement of the liquid storage tank 25 and the porous material layer 20 is adjustable according to the practical requirements. Preferably but not exclusively, the altitude level of the liquid storage tank 25 is higher than the altitude level of the porous material layer 20. Due to the effect of gravity, the liquid 24 stored in the liquid storage tank 25 is continuously transported from the liquid storage tank 25 into the porous material layer 20 through the transporting tube 23. Furthermore, by adjusting the pore size, porosity or porous density of the porous material layer 20, the liquid 24 is retained in the accommodation space 22 and the evaporation surface 21 of the porous material layer 20 but not overflows from the evaporation surface 21. Certainly, the present disclosure is not limited thereto, and not redundantly described herein.

Figure 2:
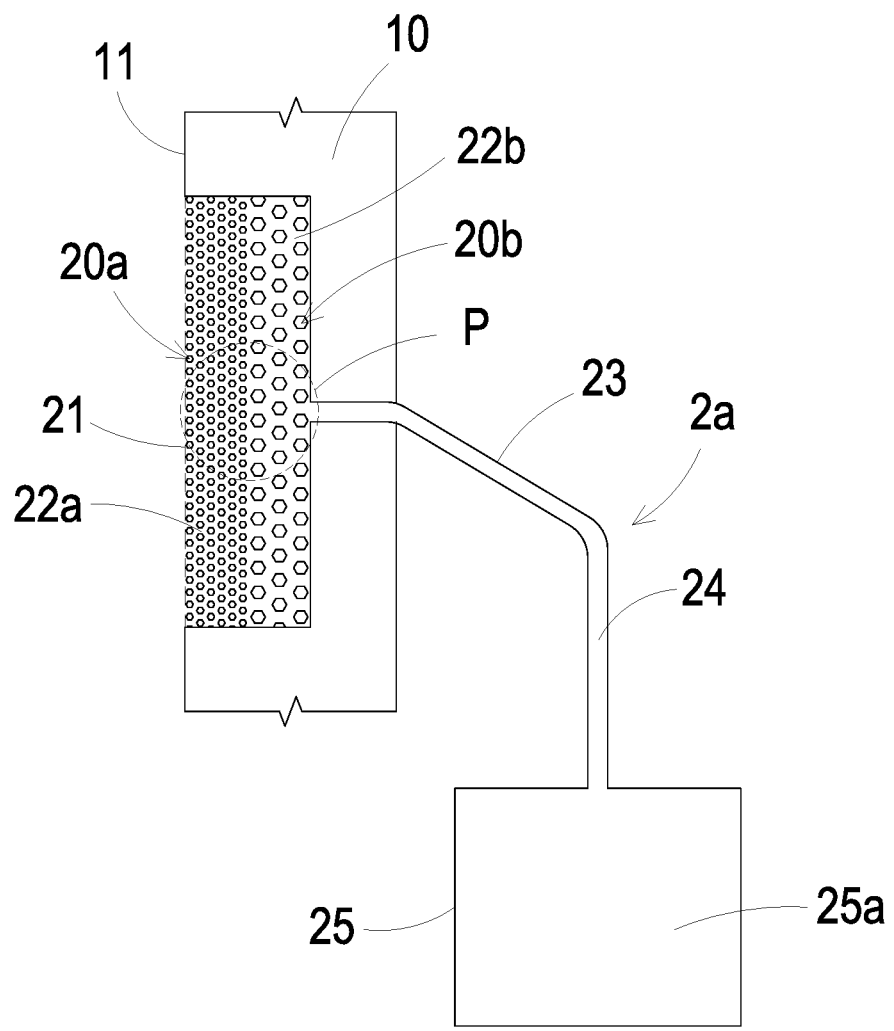
FIG. 2 shows a heat dissipation device and a robot using the same according to a second embodiment of the present disclosure.
Figure 3:
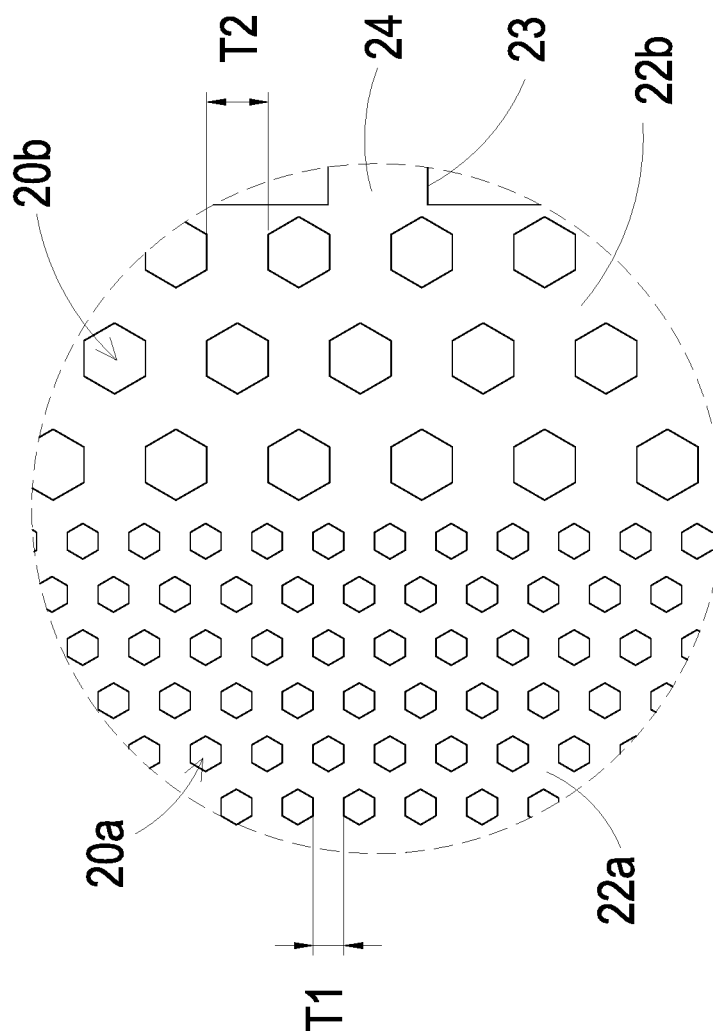
FIG. 3 is an enlarged view of the region P in FIG. 2.

FIG. 2 shows a heat dissipation device and a robot using the same according to a second embodiment of the present disclosure. FIG. 3 is FIG. 3 is an enlarged view of the region P in FIG. 2. In the embodiment, the structures, elements and functions of the heat dissipation device 2a and the robot 1a using the same are similar to those of the heat dissipation device 2 and the robot 1 in FIG. 1. The elements and features indicated by the numerals similar to those of the first embodiment mean similar elements and features, and are not redundantly described herein. Preferably but not exclusively, in the embodiment, the heat dissipation device 2a is embedded within the housing 10 of the robot 1a and partially exposed from the housing surface 11. Different from the heat dissipation device 2 including one porous material layer 20 in FIG. 1, in the embodiment, the heat dissipation device 2a has at least one first porous material layer 20a and at least one second porous material layer 20b. The at least one first porous material layer 20a has at least one first accommodation space 22a, and the at least one second porous material layer 20b has at least one second accommodation space 22b. In the embodiment, the first accommodation space 22a of the first porous material layer 20a is connected to the at least one evaporation surface 21. The second accommodation space 22b of the second porous material layer 20b is connected to the transporting tube 23. The liquid 24 stored in the liquid storage tank 25 is transported through the transporting tube 23 via for example but not limited to the action of the capillary phenomenon, flows through the second accommodation space 22b and the first accommodation space 22a sequentially, and is further introduced into the at least one evaporation surface 21. Notably, in the embodiment, the first porous material layer 20a has a first average pore diameter T1, the second porous material layer 20b has a second average pore diameter T2, and the first average pore diameter T1 is equal to or less than the second average pore diameter T2. Preferably but not exclusively, the first average pore diameter T1 is less than 0.1 mm, and the second average pore diameter T2 is ranged from 0.1 mm to 1 mm. In addition, the first porous material layer 20a has a first porosity, the second porous material layer has a second porosity, and the first porosity is equal to or less than the second porosity. Preferably but not exclusively, the first porosity is ranged from 15% to 50%, and the second porosity is ranged from 50% to 90%. In other words, the first porous material layer 20a disposed adjacent to the evaporation surface 21 has a plurality of communication apertures having a smaller size and a dispersed arrangement, and it is beneficial to ensure that the liquid 24 is continuously transported to the evaporation surface 21 for heat dissipation via evaporation without overflowing from the evaporation surface 21. The second porous material layer 20b disposed adjacent to the transporting tube 23 has a plurality of communication apertures having a larger size and a close arrangement, and a larger second accommodation space 22b is provided to contain the liquid 24. It ensures that the liquid is sufficient and continuously transported to the evaporation surface 21. Certainly, in other embodiments, the number, the size and the arrangement of the first porous material layer 20a or the second porous material layer 20b are adjustable according to the practical requirements, and the present disclosure is not limited thereto. Therefore, by adjusting the pore sizes, porosities or porous densities of the first porous material layer 20a and the second porous material layer 20b, the retention and the replenishment speed of the liquid 24 maintained in the first porous material layer 20a and the second porous material layer 20b are increased effectively. It is advantageous of enhancing the heat dissipation efficiency of the housing 10 of the robot 1a.

Figure 4:
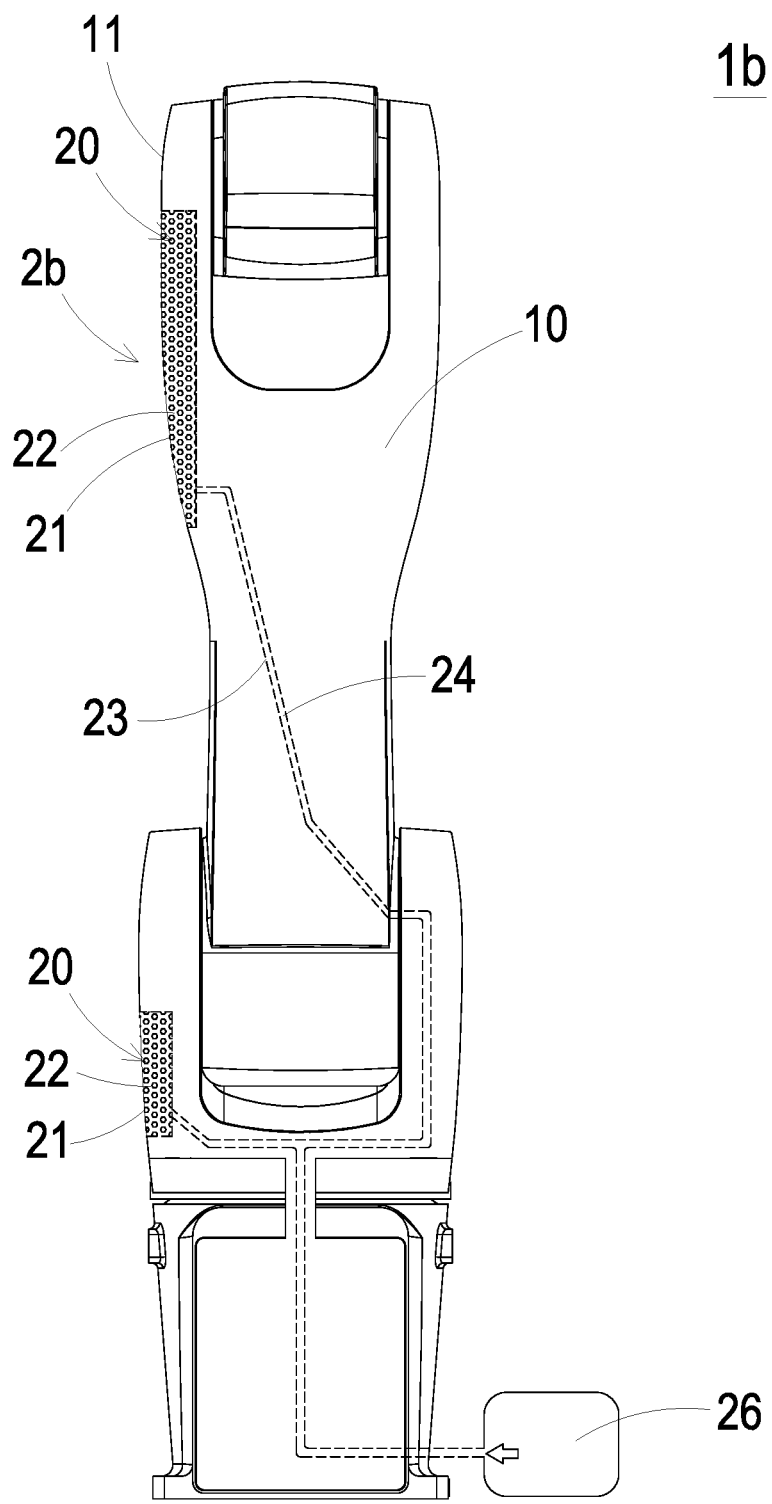
FIG. 4 shows a heat dissipation device and a robot using the same according to a third embodiment of the present disclosure.

FIG. 4 shows a heat dissipation device and a robot using the same according to a third embodiment of the present disclosure. In the embodiment, the structures, elements and functions of the heat dissipation device 2b and the robot 1b using the same are similar to those of the heat dissipation device 2 and the robot 1 in FIG. 1. The elements and features indicated by the numerals similar to those of the first embodiment mean similar elements and features, and are not redundantly described herein. In the embodiment, the heat dissipation device 2b is embedded within the housing 10 of the robot 1b and partially exposed from the housing surface 11. Different from the heat dissipation device 2 in FIG. 1, in the embodiment, the heat dissipation device 2b further has a pressurizing module 26. Preferably but not exclusively, the pressurizing module 26 is separately disposed outside the housing 10 of the robot 1b, and is connected to the transporting tube 23 for providing an additional driving force. The liquid 24 is transported to the accommodation space 22 through the transporting tube 23 by the additional driving force. Since the pressurizing module 26 can provide the additional driving force to transport the liquid 24, in the embodiment, the transporting tube 23 has an inner diameter ranged from 2 mm to 30 mm. By disposing the pressurizing module 26 in connection with the transporting tube 23 having a larger diameter, it is more advantageous to ensure that the liquid 24 is sufficient and smoothly transported to the evaporation surfaces 21 of the two porous material layers 20 at two locations for heat dissipation via convection and evaporation. Certainly, the present disclosure is not limited thereto.

Figure 5B:
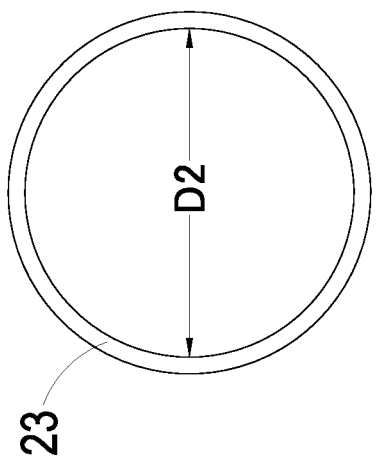
FIG. 5B shows a second exemplary structure of the transporting tube of the heat dissipation device according to the embodiment of the present disclosure.
Figure 5A:
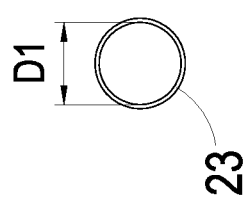
FIG. 5A shows a first exemplary structure of the transporting tube of the heat dissipation device according to the embodiment of the present disclosure.
Figure 5C:
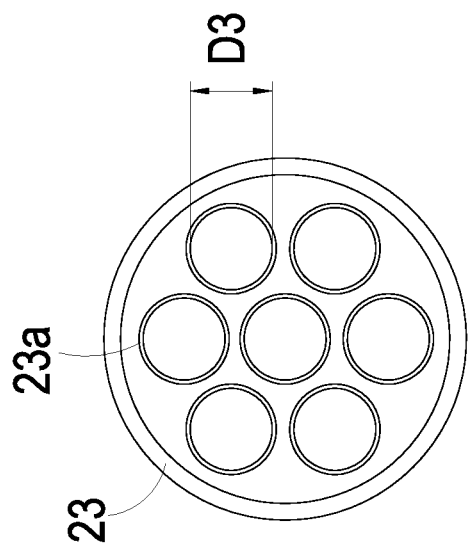
FIG. 5C shows a third exemplary structure of the transporting tube of the heat dissipation device according to the embodiment of the present disclosure.

It should be further noted that, in the foregoing embodiments, the liquid 24 is transported through the transporting tube 23, which can be selectively adjusted according to the practical requirements. For example, the transportation of the liquid 24 is achieved by the capillary force or the additional driving force of the pressurizing module 26. FIGS. 5A to 5C show three exemplary structures of the transporting tube of the heat dissipation device according to the embodiment of the present disclosure. As shown in FIG. 1 and FIG. 5A, the transporting tube 23 in the first exemplary structure has an inner diameter D1 ranged from 0.5 mm to 2 mm. In case of that, the liquid 24 is spontaneously transported into the accommodation space 22 of the porous material layer 20 via the capillary action of the transporting tube 23 and exposed from the evaporation surface 21. As shown in FIG. 4 and FIG. 5B, the transporting tube 23 in the second exemplary structure has an inner diameter D2 ranged from 2 mm to 30 mm. In case of that, the liquid 24 is transported into the accommodation space 22 of the porous material layer 20 by the driving force provided by the additional pressurized module 26 and exposed to the evaporation surface 21. With the control of the driving force of the pressurizing module 26, it is advantageous to ensure that the liquid 24 is transported sufficiently and smoothly to the evaporation surface 21 of the porous material layer 20 for heat dissipation via convection and evaporation. Certainly, in other embodiments, the transporting tube 23 is adjustable according to the practical requirements. In the third exemplary structure, as shown in FIG. 1 and FIG. 5C, the transporting tube 23 has a plurality of microtubules 23a, which are for example wrapped within the transporting tube 23. Moreover, each of the microtubules 23a is in fluid communication with the at least one accommodation space 22. Preferably but not exclusively, each of the microtubules 23a has an inner diameter D3 ranged from 0.5 mm to 2 mm. In case of that, the liquid 24 is spontaneously transported into the accommodation space 22 of the porous material layer 20 via the capillary action of each microtubule 23a and exposed from the evaporation surface 21. Accordingly, with the transporting tube 23 or the microtubules 23a in fluid communication with the accommodation space 22 of the porous material layer 20, the liquid 24 is smoothly and continuously supplied to the accommodation space layer 20 by the capillary action or the driving force of the additional pressurizing module 26, and flows into the evaporation surface 21 for heat dissipation via convection and evaporation. Thus, the temperature of the housing surface 11 of the robot 1 is decreased. It prevents from accumulating the heat generated by the robot 1 during operation, and the abnormal operation and the malfunction of the robot 1 are avoided.

In summary, the present disclosure provides a heat dissipation device and a robot using the same. A porous material layer is added to a designed area of a housing of the robot by, for example directly machining or additional mounting. The porous material layer is coupled to an internal transporting tube to transport a liquid to the housing surface for heat dissipation. Since an evaporation surface of the porous material layer keeps the liquid exposed from the housing surface, the liquid supplied to evaporation surface undergoes the convection and evaporation in specific conditions of temperature, airflow or natural evaporation, so at to dissipate the heat. Consequently, the liquid becomes a gas due to phase change, and a lot of heat generated by the body of the robot is dissipated therefrom. On the other hand, by changing the porosity or porous density of the porous material layer in a single layer or multiple layers, the retention and the replenishment speed of the liquid in the porous material layer is increased, and it is advantageous of enhancing the heat dissipation efficiency of the housing of the robot. In addition, the transporting tube in connection with the porous material layer is further implemented through the capillary action or an additional pressurized module to drive the liquid continuously to the evaporation surface of the porous material layer, so that the heat is dissipated via convection and evaporation. Thus, the temperature of the housing surface of the robot is reduced. It prevents from accumulating the heat generated by the robot during operation, and the abnormal operation or malfunction of the robot is avoided.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat dissipation device comprising:
   at least one porous material layer disposed on a housing surface of a robot, wherein the at least one porous material layer has at least one evaporation surface and at least one accommodation space, wherein the at least one porous material layer passes through the housing surface to form the at least one evaporation surface, wherein the at least one evaporation surface is surrounded by the housing surface, and the at least one evaporation surface and the at least one accommodation space are in fluid communication with each other;
   a transporting tube connected to the at least one porous material layer and in fluid communication with the at least one accommodation space; and
   a liquid transported into the at least one accommodation space through the transporting tube and exposed through the evaporation surface, wherein the liquid evaporates at the at least one evaporation surface to reduce a temperature of the housing surface of the robot.

2. The heat dissipation device according to claim 1, wherein the at least one porous material layer has an average pore diameter and a porosity, the average pore diameter is less than 0.1 mm, and the porosity is ranged from 15% to 90%.

3. The heat dissipation device according to claim 1, wherein the at least one porous material layer further has at least one first porous material layer and at least one second porous material layer, the at least first porous material layer has at least one first accommodation space, and the at least one second porous material layer has at least one second accommodation space, wherein the at least one first accommodation space is connected to the at least one evaporation surface, the at least one second accommodation space is connected to the transporting tube, and the liquid is transported from the transporting tube, flows through the at least one second accommodation space and the at least one first accommodation space, and is transported to the at least one evaporation surface.

4. The heat dissipation device according to claim 3, wherein the at least one first porous material layer has a first average pore diameter, the at least one second porous material layer has a second average pore diameter, and the first average pore diameter is equal to or less than the second average pore diameter, wherein the first average pore diameter is less than 0.1 mm, and the second average pore diameter is ranged from 0.1 mm to 1 mm.

5. The heat dissipation device according to claim 3, wherein the at least one first porous material layer has a first porosity, the at least one second porous material layer has a second porosity, and the first porosity is equal to or less than the second porosity, wherein the first porosity is ranged from 15% to 50%, and the second porosity is ranged from 50% to 90%.

6. The heat dissipation device according to claim 1, further comprising a liquid storage tank having a liquid storage space and connected to the transporting tube, wherein the liquid storage space is in fluid communication with the at least one accommodation space through the transporting tube.

7. The heat dissipation device according to claim 6, wherein the at least one porous material layer has an altitude level higher than that of the liquid storage tank.

8. The heat dissipation device according to claim 1, wherein the transporting tube has an inner diameter ranged from 0.5 mm to 2 mm.

9. The heat dissipation device according to claim 1, further comprising a pressurizing module connected to the transporting tube and driving the liquid to flow into the at least one accommodation space through the transporting tube, wherein the transporting tube has an inner diameter ranged from 2 mm to 30 mm.

10. The heat dissipation device according to claim 9, wherein the transporting tube has a plurality of microtubules, and each of the microtubules is in fluid communication with the at least one accommodation space, wherein each of the microtubules has an inner diameter ranged from 0.5 mm to 2 mm.

11. A robot comprising:
a housing having a housing surface; and
a heat dissipation device embedded within the housing and partially exposed from the housing surface, wherein the heat dissipation device comprises:
at least one porous material layer disposed on the housing surface of the robot, wherein the at least one porous material layer has at least one evaporation surface and at least one accommodation space, wherein the at least one porous material layer passes through the housing surface to form the at least one evaporation surface, wherein the at least one evaporation surface is surrounded by the housing surface, and the at least one evaporation surface and the at least one accommodation space are in fluid communication with each other;
a transporting tube connected to the at least one porous material layer and in fluid communication with the at least one accommodation space; and
a liquid transported into the at least one accommodation space through the transporting tube and exposed through the evaporation surface, wherein the liquid evaporates at the at least one evaporation surface to reduce a temperature of the housing surface of the robot.

12. The robot according to claim 11, wherein the at least one porous material layer has an average pore diameter and a porosity, the average pore diameter is less than 0.1 mm, and the porosity is ranged from 15% to 90%.

13. The robot according to claim 11, wherein the at least one porous material layer further has at least one first porous material layer and at least one second porous material layer, the at least first porous material layer has at least one first accommodation space, and the at least one second porous material layer has at least one second accommodation space, wherein the at least one first accommodation space is connected to the at least one evaporation surface, the at least one second accommodation space is connected to the transporting tube, and the liquid is transported from the transporting tube, flows through the at least one second accommodation space and the at least one first accommodation space, and is transported to the at least one evaporation surface.

14. The robot according to claim 13, wherein the at least one first porous material layer has a first average pore diameter, the at least one second porous material layer has a second average pore diameter, and the first average pore diameter is equal to or less than the second average pore diameter, wherein the first average pore diameter is less than 0.1 mm, and the second average pore diameter is ranged from 0.1 mm to 1 mm.

15. The robot according to claim 13, wherein the at least one first porous material layer has a first porosity, the at least one second porous material layer has a second porosity, and the first porosity is equal to or less than the second porosity, wherein the first porosity is ranged from 15% to 50%, and the second porosity is ranged from 50% to 90%.

16. The robot according to claim 11, wherein the heat dissipation device further has a liquid storage tank having a liquid storage space and connected to the transporting tube, wherein the liquid storage space is in fluid communication with the at least one accommodation space through the transporting tube.

17. The robot according to claim 16, wherein the at least one porous material layer has an altitude level higher than that of the liquid storage tank.

18. The robot according to claim 11, wherein the transporting tube has an inner diameter ranged from 0.5 mm to 2 mm.

19. The robot according to claim 11, wherein the heat dissipation device further has a pressurizing module connected to the transporting tube and configured to drive the liquid to flow into the at least one accommodation space through the transporting tube, wherein the transporting tube has an inner diameter ranged from 2 mm to 30 mm.

20. The robot according to claim 19, wherein the transporting tube has a plurality of microtubules, and each of the microtubules is in fluid communication with the at least one accommodation space, wherein each of the microtubules has an inner diameter ranged from 0.5 mm to 2 mm.

* * * * *